United States Patent
Deng

(10) Patent No.: US 7,983,572 B2
(45) Date of Patent: Jul. 19, 2011

(54) ELECTRO-ABSORPTION MODULATOR INTEGRATED WITH A VERTICAL CAVITY SURFACE EMITTING LASER

(75) Inventor: Hongyu Deng, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 260 days.

(21) Appl. No.: 11/170,906

(22) Filed: Jun. 30, 2005

(65) Prior Publication Data
US 2007/0002917 A1    Jan. 4, 2007

(51) Int. Cl.
*H04B 10/00* (2006.01)
(52) U.S. Cl. .......................... 398/201; 398/182
(58) Field of Classification Search .......... 398/182–201, 398/135–139
See application file for complete search history.

(56) References Cited

U.S. PATENT DOCUMENTS

| | | | | |
|---|---|---|---|---|
| 4,811,352 A * | 3/1989 | Suzuki et al. | | 372/45.01 |
| 5,401,983 A * | 3/1995 | Jokerst et al. | | 257/82 |
| 5,414,726 A * | 5/1995 | Raj et al. | | 372/26 |
| 5,426,312 A * | 6/1995 | Whitehead | | 257/21 |
| 5,495,360 A * | 2/1996 | Yoo | | 359/248 |
| 5,499,259 A | 3/1996 | Makita | | |
| 5,625,636 A * | 4/1997 | Bryan et al. | | 372/50.124 |
| 5,838,714 A * | 11/1998 | Delorme | | 372/96 |
| 6,026,108 A * | 2/2000 | Lim et al. | | 372/50.11 |
| 6,046,065 A * | 4/2000 | Goldstein et al. | | 438/46 |
| 6,330,265 B1 * | 12/2001 | Kinoshita | | 372/50.12 |
| 6,459,709 B1 * | 10/2002 | Lo et al. | | 372/20 |
| 6,459,716 B1 * | 10/2002 | Lo et al. | | 372/50.1 |
| 6,556,610 B1 * | 4/2003 | Jiang et al. | | 372/75 |
| 6,628,696 B2 * | 9/2003 | Thornton | | 372/98 |
| 6,661,825 B2 * | 12/2003 | Evans et al. | | 372/50.1 |
| 6,803,604 B2 * | 10/2004 | Takahashi et al. | | 257/80 |
| 6,819,466 B2 * | 11/2004 | Tayebati | | 359/260 |
| 6,853,666 B2 * | 2/2005 | Evans et al. | | 372/50.1 |
| 6,922,423 B2 * | 7/2005 | Thornton | | 372/38.07 |
| 6,963,597 B2 * | 11/2005 | Evans et al. | | 372/102 |
| 7,050,689 B2 * | 5/2006 | Wipiejewski et al. | | 385/129 |
| 7,369,583 B2 * | 5/2008 | Ledentsov et al. | | 372/20 |
| 7,391,800 B2 * | 6/2008 | Takahashi | | 372/50.1 |
| 2002/0097768 A1 | 7/2002 | Thornton | | |
| 2002/0101898 A1 * | 8/2002 | Lo et al. | | 372/46 |
| 2004/0105476 A1 * | 6/2004 | Wasserbauer | | 372/50 |
| 2004/0213583 A1 * | 10/2004 | Guenter | | 398/202 |
| 2005/0025199 A1 * | 2/2005 | Ma | | 372/20 |
| 2005/0040415 A1 | 2/2005 | Kish, Jr. et al. | | |
| 2005/0271092 A1 * | 12/2005 | Ledentsov et al. | | 372/20 |
| 2006/0198404 A1 * | 9/2006 | Henrichs | | 372/29.02 |
| 2006/0227823 A1 * | 10/2006 | Mohammed et al. | | 372/26 |

* cited by examiner

*Primary Examiner* — Agustin Bello
(74) *Attorney, Agent, or Firm* — Maschoff Gilmore & Israelsen

(57) ABSTRACT

An electro-absorption modulator integrated with a vertical cavity surface emitting laser (VCSEL). An electro-absorption modulator (EAM) is integrated or grown on a VCSEL. The electro-absorption modulator may be separated from the VCSEL by a semi-insulating or nonconducting layer. Contacts on the EAM can bias the EAM such that light emitted by the VCSEL is selectively absorbed. Thus, the VCSEL can emit a constant wave light that is modulated by the integrated EAM.

22 Claims, 3 Drawing Sheets

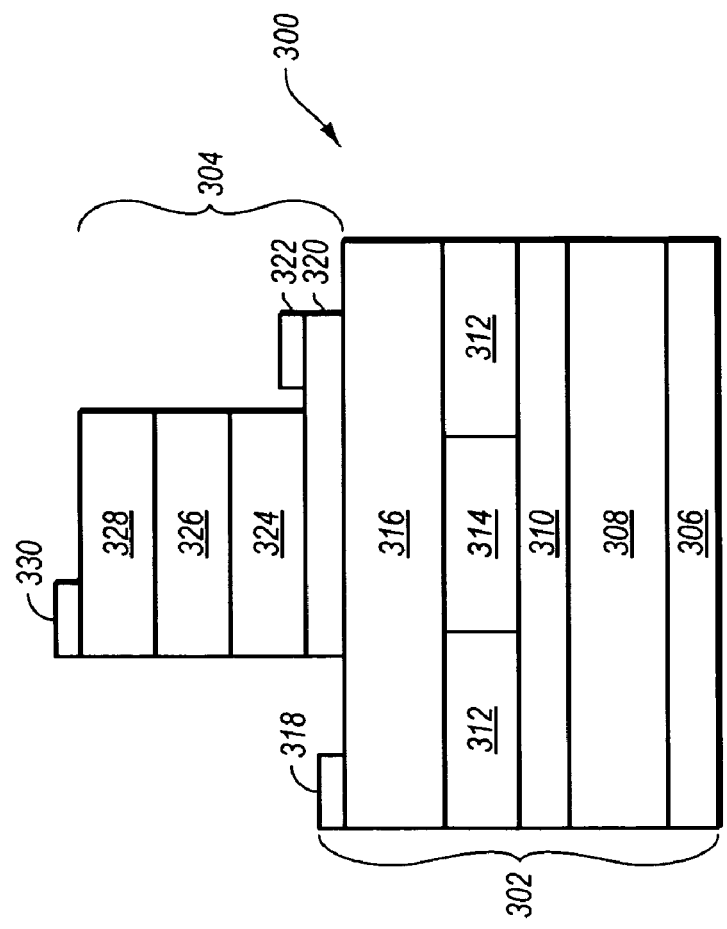
Fig. 3
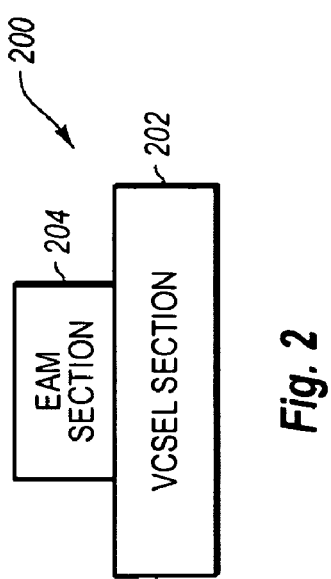
Fig. 2
Fig. 4

ELECTRO-ABSORPTION MODULATOR INTEGRATED WITH A VERTICAL CAVITY SURFACE EMITTING LASER

CROSS-REFERENCE TO RELATED APPLICATIONS

Not applicable.

BACKGROUND OF THE INVENTION

1. The Field of the Invention

Embodiments of the invention relate to the field of semiconductor lasers. More particularly, embodiments of the invention relate to a vertical cavity surface emitting laser integrated with an electro-absorption modulator.

2. The Relevant Technology

Computer and data communications networks continue to proliferate due to declining costs, increasing performance of computer and networking equipment, and increasing demand for communication bandwidth. Communications networks—including wide area networks ("WANs"), local area networks ("LANs"), metropolitan area networks ("MANs"), and storage area networks ("SANS")—allow increased productivity and use of distributed computers or stations through the sharing of resources, the transfer of voice and data, and the processing of voice, data and related information at the most efficient locations.

As the demand for networks has grown, network technology has developed to the point that many different physical configurations presently exist. Examples include Gigabit Ethernet ("GE"), 10 GE, Fiber Distributed Data Interface ("FDDI"), Fibre Channel ("FC"), Synchronous Optical Network ("SONET") and InfiniBand networks. These networks, and others, typically conform to one of a variety of established standards, or protocols, which set forth rules that govern network access as well as communications between and among the network resources.

In some optical networks, there are certain requirements related to transmission distance and data rate. When these requirements are relatively high, edge-emitting Distributed Feedback Lasers (sometimes with external modulators) are conventionally used because of the difficulties in using comparatively less costly VCSEL lasers. For example, as the data rate for an 850 nm VCSEL is increased to 10 Gbits/second and greater, the aperture size of the VCSEL is reduced to less than 10 micrometers to improve speed. Unfortunately, the small aperture size of such a VCSEL reduces the reproducibility and the reliability of the VCSEL.

In addition, a conventional VCSEL often has a high RC constant. The RC constant can limit the performance of the VCSEL to around 10 Gbit/second. High data rate applications would therefore require an array of VCSELs operated in parallel, which would significantly increase system cost. Further, conventional VCSELs at higher wavelengths such as 1.31 micrometers or 1.55 micrometers, are relatively expensive and often have reliability issues. As a result, applications associated with wavelengths such as 1.31 micrometers or 1.55 micrometers use edge-emitting FP (Fabry Perot) and DFB lasers. Links over very long distances typically require light sources operating at near 1.55 micrometers due to the low loss of the single mode fiber at this wavelength. Directly modulated-lasers including DFBs and VCSELs that operate at these wavelengths experience chirp problems that prevent their use at higher data rates and over longer distances. To reduce the chirp of the transmission, electro-absorption modulator edge emitting lasers (EMLs) are used where the optical power of the DFB laser section is maintained constant while the data signal is inserted through the electro-absorption modulator (EAM) section.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 2 illustrates a block diagram of a vertical cavity surface emitting laser integrated with an electro-absorption modulator;

FIG. 3 illustrates exemplary layers of an electro-absorption modulator integrated with a vertical cavity surface emitting laser;

FIG. 4 illustrates another embodiment of the electro-absorption modulator which includes mirror layers;

DETAILED DESCRIPTION OF THE PREFERRED EMBODIMENTS

Figure 1:
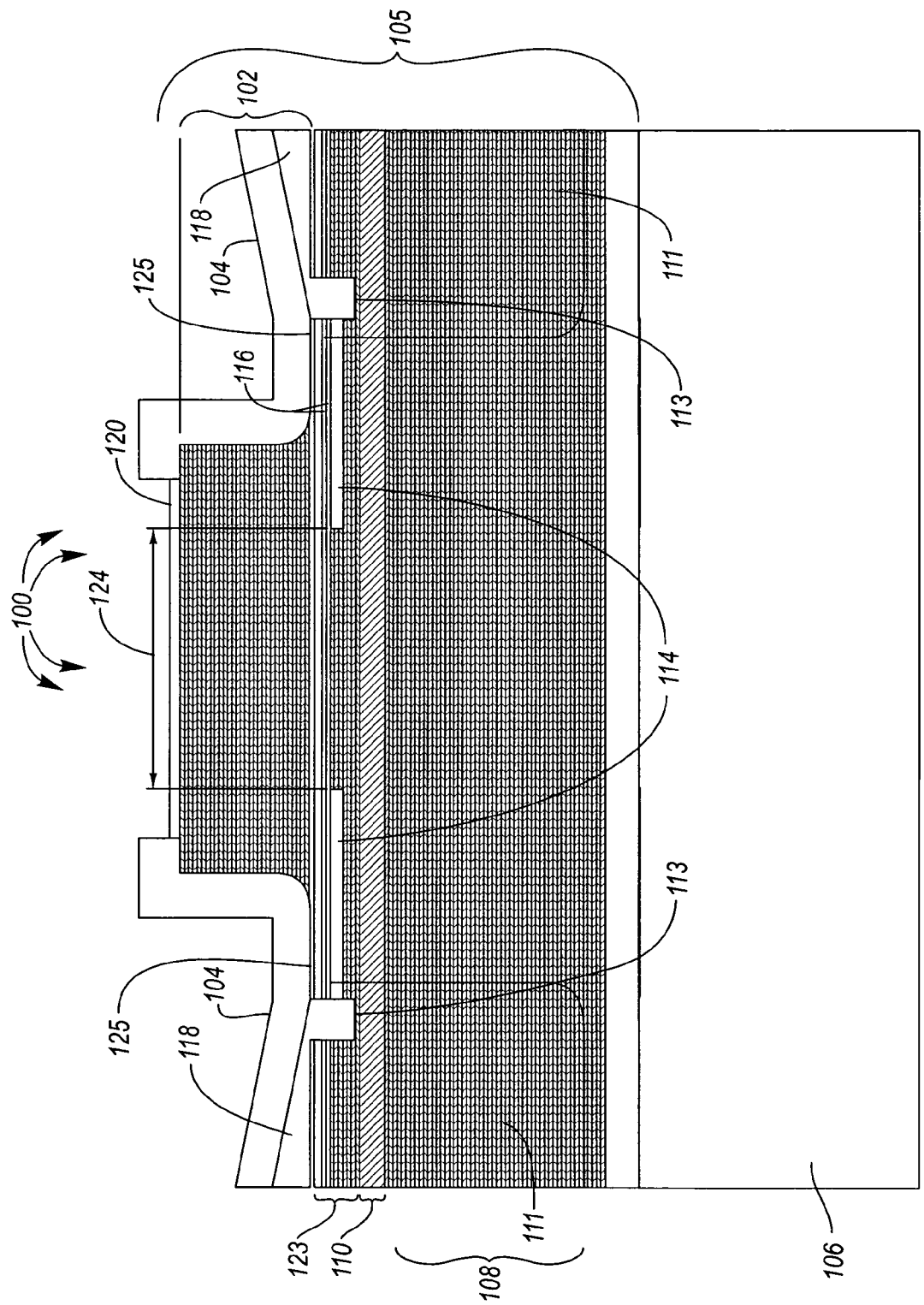
FIG. 1 illustrates one embodiment of a vertical cavity surface emitting laser.

Solid-state semiconductor lasers are important devices in applications such as optoelectronic communication systems and high-speed printing systems. Among the different types of lasers, there has been an increased interest in vertical cavity surface emitting lasers (VCSELs). One reason for growing interest in VCSELs is that edge emitting lasers produce a beam with a large angular divergence compared to VCSELs, making efficient collection of the emitted beam more difficult. Furthermore, edge emitting lasers cannot be easily tested until the wafer is cleaved into individual devices, the edges of which form the mirror facets of each device. By contrast, not only does the beam of a VCSEL have a small angular divergence, a VCSEL emits light normal to the surface of the wafer. Additionally, because VCSELs generally incorporate mirrors monolithically in their design, they allow for on-wafer testing and the fabrication of one-dimensional or two-dimensional laser arrays. The absence of the cleaving operation also greatly enhance the manufacturing yield of VCSELs.

VCSELs are typically made by growing several layer sections on a substrate material. VCSELs include a first mirrored stack, formed on the substrate by semiconductor manufacturing techniques, an active region, formed on top of the first mirrored stack, and a second mirrored stack formed on top of the active region. By providing a first contact on top of the second mirrored stack, and a second contact on the backside of the substrate, a current is generated through the active region. Currents through the VCSEL above a threshold current cause laser emissions from the active layer as electrons from the conduction band recombine with holes in the valence band, producing photons and thereby generating the amplified stimulated light emission.

Often, the active region further includes one or more quantum wells sandwiched between two barriers layers, which are further sandwiched by confining cladding layers. The confining layers or regions are used to provide electrical confinement of minority carriers. By selecting the appropriate materials for the quantum well, the confining layers, and the barrier layers, a VCSEL generally may be grown or fabricated that generates light at a desirable, predetermined wavelength. For example, by using InGaAs quantum wells with different composition and thickness on GaAs substrates, VCSELs emitting at wavelengths from 0.9 to 1.0 micrometers can be produced. The use of InGaAs quantum wells, however, causes strain in the quantum wells. And higher strain InGaAs produces longer emission wavelength. If the quantum wells are grown past their critical thickness, they can relax by creating dislocations, and thus a poor quality active region results.

VCSELs made with GaAs quantum wells that emit light in the 850 nanometer range are known in the art. Because the quantum well for the short wavelength 850 nanometer VCSELs is made from GaAs (the same material as the substrate) the various epitaxially deposited layers, whose thickness is related to wavelength, are able to maintain the minimal mechanical strain without mechanical relaxation. If one were to use InGaAs in the active region at the larger 1.3 µm wavelength device range (e.g., 1200-1650 nm), however, the lattice mismatch is generally such that large layers would tend to relax their strains and suffer dislocations, produce slip lines or develop island growth, which would interfere with proper lasing.

In order to go to the proper bandgap for what is referred to in the art as a 1.3 µm wavelength or 1.55 µm (i.e. greater than 1200 nm) semiconductor lasers, one generally uses AlInGaAs or InGaAsP on InP substrate, or InGaAs quantum dots, InGaAsSb, or InGaAsN on GaAs substrate. Other semiconductor materials may also be used.

The thickness of the various layers in the active region, while not arbitrary, has some flexibility within the constraints of the design and the process. The combined thickness of the spacers, the confining layers, and the layers of the active regions sandwiched by the mirrors must be such that a Fabry-Perot resonator is formed. The quantum wells should generally be positioned so that they are roughly located at antinodes of the optical electric field. These two requirements define the spacer thickness in terms of the other layer thicknesses.

Embodiments of the invention integrate an electro-absorption modulater (EAM) with the VCSEL. Integrating an EAM with the VCSEL can reduce the relevance of the intrinsic speed and wavelength chirp of the VCSEL itself. The EAM enables high speed modulation through the EAM portion. As a result, embodiments of the invention provide higher bandwidth and lower chirp compared with conventional VCSELs.

With reference now FIG. 1, an illustrative embodiment includes a VCSEL 100 with an undoped top mirror 102 and intracavity contact 104. The VCSEL 100 is formed from an epitaxial structure 105 that includes various layers of semiconductor a materials that will be described in more detail below. The epitaxial structure 105 goes through various etching, deposition and oxide growth stages in the VCSEL 100 or a formation.

The VCSEL 100 is formed on a substrate 106. The substrate 106, in this example, is a gallium arsenide (GaAs) substrate or an Indium Phosphide (InP) substrate. In other embodiments, the substrate 106 may be other material such as other group III IV semiconductor materials.

A bottom mirror 108 is formed on the substrate 106. The bottom mirror has the same conductivity type as the substrate. In the example, the bottom mirror and substrate are n-type. The bottom mirror 108 is a distributed Bragg reflector (DBR) mirror that includes a number of alternating layers of high and low index of refraction materials. In the example shown, the bottom mirror 108 includes alternating layers of aluminum arsenide (AlAs) and GaAs. The bottom mirror 108 is typically doped with a donor impurity such as silicon such that the bottom mirror is conductive.

A special ramp may be formed between the alternating layers of the bottom mirror 108. The ramp provides a gradual change of electronic affinity between the alternating layers. In the embodiment shown, the ramp includes a step from AlAs to $Al_xGa_{1-x}As$ where x is about 33 to 35% followed by an essentially linear ramp of aluminum composition from about 33% to zero (GaAs) after the step. The electron affinity is essentially constant across the step, and thus there is no need to ramp through the step. Examples of similar special ramps are disclosed in U.S. patent application Ser. No. 10/767,920, titled "Electron Affinity Engineered VCSELs" filed Jan. 29, 2004, which is incorporated herein by reference.

An active region 110 is formed on the bottom mirror 108 and is bounded laterally by proton bombarded isolation implants 111 which will be discussed in more detail below and isolation trenches 113. The active region 110 includes one or more quantum well(s), flattening layer(s) and cap layer(s) as described hereinbelow. The central region of the quantum wells under the oxide aperture 124 may also be referred to as the optical gain region. This central region of the quantum wells is the location where current through the active region 110 and the presence of injected free carriers causes population inversion and optical gain. These free carriers moving from conduction band quantum well states to valence band quantum well states (i.e. across the band gap) cause the emission of photons. An oxide layer 114 is formed in the conduction layer region 123 above the active layer 110 to provide an aperture 124 for lateral definition of the laser optical cavity and for directing bias current to the central region of the VCSEL active region 110.

In the embodiment shown, the conduction layer region 123 has a conductivity type opposite that of the substrate and bottom mirror and further includes a periodically doped top portion 116. In the example the conduction layer region 123 is p-type. Two or three periodically doped layers 116 are heavily doped at the optical electric field minima so as to provide a low resistance lateral current path for directing current from the Ohmic contact region 125 to the central region of the active region 110 located under the oxide aperture 124. The conduction layers 116 may be doped at from about $5\times10^{19}$ to about $1\times10^{20}$ at some distance less than about $1\times10^{-18}$ away from the minimum of the optical electric field. In the embodiment shown, there are two periodically doped conduction layers 116 each having a sheet resistance of about 500 Ohms per square are doped with an acceptor impurity such as carbon. Using two conduction layers results in a total sheet resistance of about 250 Ohms per square.

Another embodiment of the invention uses three periodically doped conduction layers 116 in the top portion of the conduction layer region 123. Each of the periodically doped conduction layers 116 has a sheet resistance of about 500 Ohms per square. Using three conduction layers results in a total sheet resistance of about 167 Ohms. This provides a reduction in series resistance which lowers power dissipation and improves VCSEL performance.

A dielectric layer 118 is formed on the conduction layers 116. The dielectric 118 is taper etched to facilitate step coverage of the top contact metal 104 that extends from the Ohmic contact region 125 to the top metal bond pad (not shown in FIG. 1). Thick dielectric 118 is provided under the bond pad to decrease the capacitance between the bond pad metal and the surface of the proton bombarded region under the bond pad which comprises the conduction layer region 123, the active layer 110, and a portion 111 of the n-type mirror 108. The intracavity contact metal 104 is connected to the top conduction layer 116 forming a top Ohmic contact. The intracavity contacts are also formed such that the intracavity contacts 104 are also connected to a bond pad (not shown) for connecting the VCSEL 100 to a current source. In the example shown, the intracavity contacts 104 extend up around the sides of the undoped top mirror 102. This provides a thermal path for dissipating thermal energy generated in the active region 110 and the conduction layer region 123.

The undoped top mirror 102 in this example is part of a mesa structure. In the example shown the undoped top mirror 102 may be for example alternating layers of higher and lower index of refraction materials. The VCSEL 100 may be constructed using a process that uses an oxide to seal the top mirror 102 during the fabrication process of the VCSEL 100. Because the top mirror 102 is sealed from the high temperature wet oxidation-process used to form the oxide layer 114, an alternate construction including alternating layers of GaAs and AlAs may be used for the top mirror 102. Layers of GaAs and AlAs may be advantageous in implementing embodiments with better thermal characteristics. The use of binary materials in the top mirror also provides the greatest refractive index difference between the mirror layers which makes it possible to achieve the desired top mirror reflectivity with a minimum number of layer pairs. The VCSEL 100 further includes an oxide dielectric 120 to protect portions of the VCSEL 100. In one exemplary embodiment the oxide dielectric 120 has an optical λ/2 thickness of the VCSEL wavelength to provide maximum optical reflectivity of at the top exit surface of the VCSEL 100.

Various alterations may be made to the VCSEL 100 within the scope of embodiments of the present invention. For example, in one embodiment, one of the conduction layers 116 may be replaced with a tunnel junction. A tunnel junction generally comprises a highly conductive diode. The highly conductive diode includes a thin heavily doped p layer of GaAs and a thin heavily doped layer of n-type GaAs. The tunnel junction layers are sufficiently heavily doped such that the resulting diode conducts by tunneling at zero bias. Low lateral sheet resistance is provided by the heavily doped n-type layer, which has much higher carrier mobility than the heavily doped p-type layer. The intracavity contact 104 is coupled to the heavily doped n-type layer using an alloyed Au:Ge contact layer under the top metal layer that forms the intracavity bond pad. The heavily doped n and p-type layers are located at or near minimums of the optical electronic field to minimize free carrier absorption. While a tunnel junction alone may not have sufficient electrical conductivity to carry the appropriate currents needed to the active region 110, using a large tunnel junction with a large surface area in combination with a conduction layer 116 may provide an adequate amount of conduction. This may allow for the use of a less than optimal tunnel junction in the VCSEL 100.

Very highly conductive tunnel junctions may be difficult to form in VCSEL structures. This difficulty results in part due to the high temperatures used when forming additional layers of the epitaxial structure 105 subsequent to formation of tunnel junctions. These high temperatures cause a diffusion of the high concentration dopants used in the heavily doped layers in the tunnel junction. This diffusion degrades the tunnel junction characteristics. However, using a less than optimal tunnel junction in conjunction with a conduction layer 116 may provide a suitable current path for directing current to the active region 110. Additionally, a highly doped optimal tunnel junction may be used if the upper mirror is deposited at a low temperature made possible by the lack of doping and conduction. The upper mirror may be, simply a dielectric stack.

In another alteration, an undoped bottom mirror, which may be grown on semi-insulating substrates, can be used as the bottom mirror 108. This further reduces free carrier absorption, and further allows for improved reflectivity and thermal conductivity by eliminating ramps between the bottom mirror 108 layers. To make contact to the n side of the p-n junction of the active region 110, a periodically doped n lower spacer (not shown) is grown between the bottom mirror 108 and the quantum wells. In this case a second intracavity contact is made after etching to the periodically doped lower spacer. Etching to the periodically doped lower spacer includes using an etch which stops on or in the periodically doped lower spacer.

While various layers of the epitaxial structure 105 have been described as being formed on other layers, this does not require that the layers be formed directly on the other layers. Rather, other intervening layers may exist between a layer and the layer in which that layer is formed. Further details regarding methods of VCSEL fabrication used in the art can be found, for example, in U.S. Pat. No. 5,903,588, incorporated herein by reference in its entirety.

FIG. 2 illustrates one embodiment of an electro-absorption modulator (EAM) integrated with a VCSEL. The device 200 includes a VCSEL section 202 and an EAM section 204. The EAM section 204, in one embodiment, is monolithically grown on the VCSEL section 202. The EAM section 204, however, can be controlled independently of the VCSEL section 202. The contacts for the EAM section 204, for example, are separate from the contacts of the VCSEL section 202. Because the EAM section 204 can be independently controlled, the VCSEL section 202 may be designed as a constant wave light source, which is typically easier to manufacture. The modulation of the constant wave light source is performed by the EAM section 204. The electro-absorption modulation provides higher bandwidth and lower chirp. In addition, the EAM section 204 can be used as a light intensity monitor, an eye safety shut-off valve, a polarization controller, and the like.

FIG. 3 illustrates another embodiment of an electro-absorption modulator integrated with a VCSEL. The device 300 includes: a VCSEL section 302 integrated with an EAM section 304. The VCSEL section 302 includes a top contact 318 and a bottom contact 306. The active region 310 is bounded by the VCSEL top mirror 316 and the VCSEL bottom mirror 308. The current aperture 314 is formed by oxidized portions 312 in this embodiment of the VCSEL 300.

The EAM section 304 includes an absorption region 326 sandwiched between a p type cladding layer 324 and an n type cladding layer 328. The EAM section 304 also includes a top contact 330 and a bottom contact 322. In this example, the EAM section 304 forms a pn junction that can be reverse biased to provide a high electrical field to the absorption region 326, which is at the center of the pn junction.

A voltage applied to the EAM section 304 can be modulated to control the intensity of the light exiting the EAM section 304. Because the modulation is provided by the EAM section 304, the intrinsic speed of the VCSEL section 302 has less significance. In fact, the VCSEL section 302, as previously stated, can be a constant wave light source.

The absorption region 326 typically has a thickness on the order of tens of microns and can be set to enhance light absorption. The layers 328 and 324 are typically in a range of several hundred angstroms to a few microns thick. The layers 328 and 324 form a pn junction and the absorption region 326 is formed at the pn junction.

FIG. 4 illustrates another embodiment of an EAM section 400. The EAM section 400 includes an active region 408 (absorption region) and cladding layers 406, 410 as previously described. The EAM section 400 also includes mirror layers 404 and 411 that sandwich the cladding layers 406, 408 and the active region 408. In one embodiment, the mirror layers or one of the mirror layers 404 and 411 are DBR mirrors that form a resonant cavity in the EAM section 400 to enhance absorption.

The EAM section 400 also includes an insulation layer 414 that separates the EAM section from the VCSEL section. The insulation layer 414 is non-conductive or semi-insulating. The insulation layer 414 helps prevent the potential at the contact 412 from influencing the current or threshold current of the VCSEL section. The insulation layer can be grown without any intentional doping or with doping to achieve a lattice match as well as a semi-insulating property. For example, the layer 414 may be doped with Fe in the case of an InP based VCSEL to achieve semi-insulation and lattice matching properties.

Figure 5:
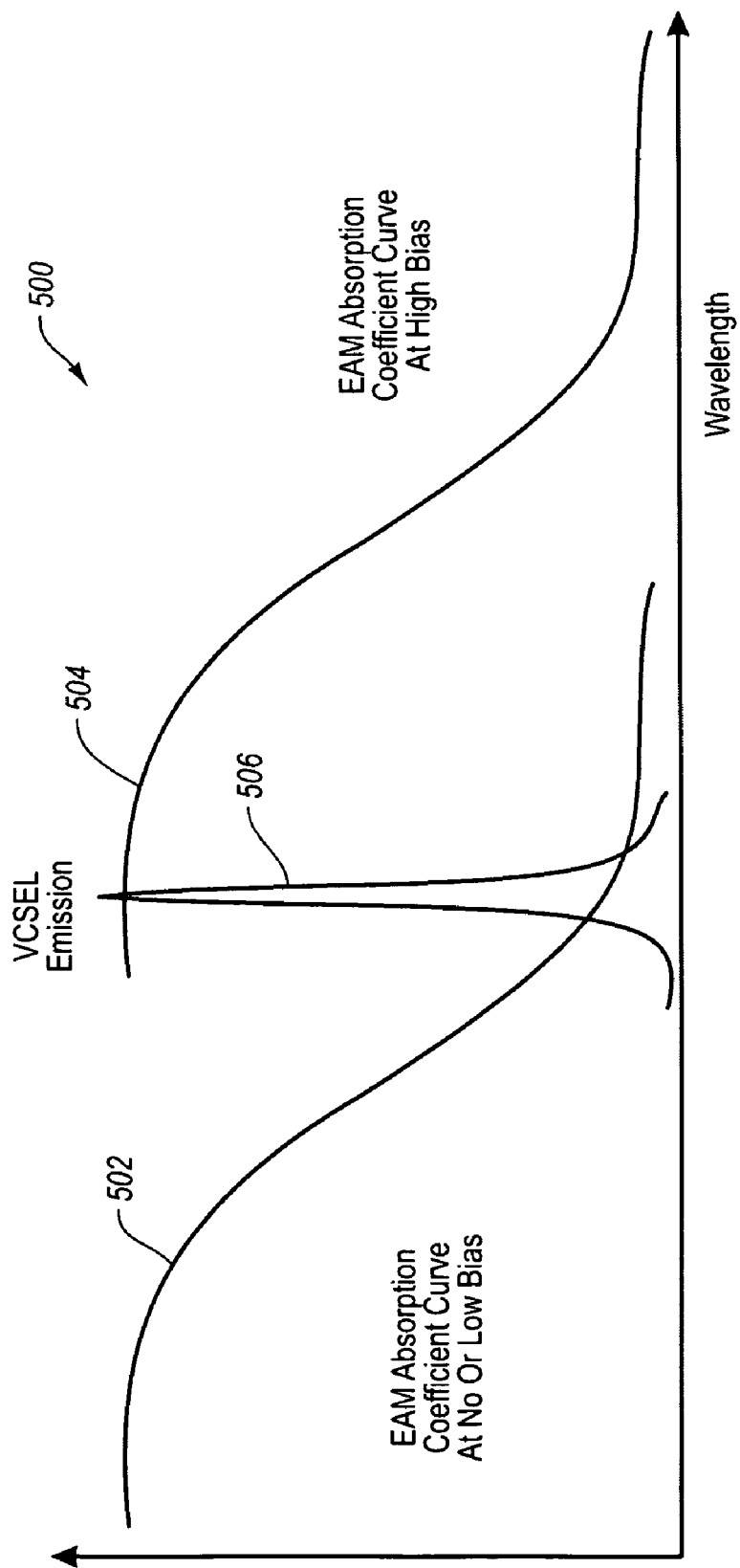
FIG. 5 illustrates the EAM absorption curve at low bias and at high bias relative to a VCSEL emission.

In one embodiment, the band edge of the absorption region in the EAM section is blue-shifted related to the VCSEL emission. The composition of the EAM section typically changes depending on the emission wavelength and/or the general composition of the VCSEL section. As one example, for active region of quartenary InGaAsP at 1.55 μm, the EAM absorption region can be InGaAsP with slightly different In and As compositions to achieve different band-gap energy. For a GaAs quantum well active region, one example of the EAM absorption region can be AlGaAs. In one embodiment, the absorption bandedge of the EAM section is blue-shifted relative to the VCSEL emission wavelength. For example, the absorption bandedge of the EAM section may be blue-shifted in a range from tens to a hundred nanometers as shown in the FIG. 5. When there is no or low bias on the EAM section, the absorption of the EAM section, as shown by the EAM absorption coefficient curve 502, has a shorter wavelength relative to the VCSEL light emission 506. The emitted light of the VCSEL can pass through the EAM section without significant loss. When high bias is applied to the EAM section, as shown by the EAM absorption coefficient curve 504, the absorption of the band-edge is shifted to longer wavelength and could cover the VCSEL emission 506. As a result the VCSEL emission suffers large absorption loss through the EAM section at higher bias. The light intensity of the VCSEL is therefore modulated by changing the bias level of the EAM section; For example, an EAM section with a bandedge at or about 800 nm may be required for a VCSEL emission at 850 nm, while an EAM section with a bandedge at approximately 1250 nanometers may be utilized with a VCSEL emission of 1310 nm.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A device comprising:
    a vertical cavity surface emitting laser comprising;
        a bottom minor;
        a top minor;
        an active region formed between the bottom minor and the top minor;
        a top laser contact formed over the top minor; and
        a bottom laser contact formed under the bottom mirror; and
    an electro-absorption modulator section integrated with and external to the vertical cavity surface emitting laser, the electro-absorption modulator section comprising:
        an n-type cladding layer;
        a p-type cladding layer;
        a top modulator contact;
        a bottom modulator contact; and
        an absorption region formed between the n-type cladding layer and the p-type cladding layer, wherein the absorption region selectively absorbs light emitted by the vertical cavity surface emitting laser to modulate the light,
    wherein the top and bottom modulator contacts are electrically separate and disconnected from both the top and bottom laser contacts and are used to bias the absorption region such that light emitted by the vertical cavity surface emitting laser is modulated.

2. The device of claim 1, the electro-absorption modulator section being monolithically formed with the vertical cavity surface emitting laser.

3. The device of claim 1, wherein the electro-absorption modulator section has a bandedge that is blue shifted relative to a bandedge of the vertical cavity surface emitting laser.

4. The device of claim 1, wherein the bandedge of the electro-absorption modulator section is blue-shifted in a range from 10 nanometers to 150 nanometers.

5. The device of claim 1, wherein the bandedge of the electro-absorption modulator section is blue-shifted in a range from 10 to 100 nanometers when the vertical cavity surface emitting laser lases at about 1310 nanometers or at 1550 nanometers.

6. The device of claim 1, wherein the bottom minor and the top mirror each comprise distributed Bragg reflector layers.

7. The device of claim 1, further comprising an insulation layer positioned between the vertical cavity surface emitting laser and the modulator contact of the electro-absorption modulator section that is closest to the vertical cavity surface emitting laser, the insulation layer preventing a potential at the closest modulator contact from influencing current in the vertical cavity surface emitting laser.

8. The device of claim 7, wherein the insulation layer is doped to achieve a lattice match and a semi-insulating property.

9. A device as defined in claim 7, wherein the insulation layer is non-conductive and/or is grown without any intentional doping.

10. The device of claim 1, wherein the electro-absorption modulator section further comprises a pair of DBR mirrors that sandwich at least the absorption region.

11. The device of claim 1, wherein the vertical cavity surface emitting laser is a constant wave light source.

12. The device of claim 1 wherein the electro-absorption modulator section is configured for at least one of an InP or GaAs based vertical cavity surface emitting laser.

13. A device comprising:
    a vertical cavity surface emitting laser comprising:
        a first distributed Bragg reflector (DBR) minor;
        a second DBR minor;
        an active region sandwiched by the first DBR minor and the second DBR minor;

a top laser contact formed over the top first DBR mirror; and a bottom laser contact formed under the second DBR mirror; and an electro-absorption modulator (EAM) monolithically integrated with, and located external to, the vertical cavity surface emitting laser, the EAM comprising:

an absorption region sandwiched by a first cladding layer and a second cladding layer, wherein a bandedge of the absorption region is blue-shifted relative to a bandedge of the active region of the vertical cavity surface emitting laser;

a third DBR mirror and a fourth DBR mirror that form a cavity that includes the absorption region;

a top modulator contact; and a bottom modulator contact, wherein the top and bottom modulator contacts are electrically separate and disconnected from both the top and bottom laser contacts and are used to bias the absorption region such that light emitted by the vertical cavity surface emitting laser is modulated.

14. The device as defined claim 13, further comprising a semi-insulating layer positioned between the vertical cavity surface emitting laser and the modulator contact of the electro-absorption modulator section that is closest to the vertical cavity surface emitting laser, the semi-insulating layer preventing a potential at the closest modulator contact from influencing current in the vertical cavity surface emitting laser.

15. A device as defined in claim 14, wherein the semi-insulating layer is doped.

16. A device as defined in claim 15, wherein the semi-insulating layer is doped with iron.

17. A device as defined in claim 13, wherein the bottom modulator contact is a p contact and the top modulator contact is an n contact, the p contact and the n contact enabling a voltage to be applied across the EAM.

18. A device as defined in claim 17, wherein the absorption region selectively absorbs light emitted by the vertical cavity surface emitting laser such that the light is modulated based on the voltage applied across the EAM.

19. A device as defined in claim 13, wherein the vertical cavity surface emitting laser is a constant light wave source.

20. A device as defined in claim 13, wherein the absorption region is a block material.

21. A device as defined in claim 13, wherein the active region of the vertical cavity surface emitting laser includes at least one of quantum wells or quantum dots.

22. A device as defined in claim 13, wherein the EAM is configured for at least one of an InP or GaAs based vertical cavity surface emitting laser.

* * * * *